(12) United States Patent
Maret et al.

(10) Patent No.: US 11,169,196 B2
(45) Date of Patent: Nov. 9, 2021

(54) PARTIAL DISCHARGE MONITORING SYSTEM WITH A COMPATIBILITY-FUNCTION FOR A VOLTAGE INDICATION SYSTEM

(71) Applicant: ABB Schweiz AG, Baden (CH)

(72) Inventors: Yannick Maret, Dättwil (CH); Kai Hencken, Lörrach (DE); Stefano Marano, Zürich (CH)

(73) Assignee: ABB Schweiz AG, Baden (CH)

( * ) Notice: Subject to any disclaimer, the term of this patent is extended or adjusted under 35 U.S.C. 154(b) by 252 days.

(21) Appl. No.: 16/458,950

(22) Filed: Jul. 1, 2019

(65) Prior Publication Data
US 2020/0003805 A1 Jan. 2, 2020

(30) Foreign Application Priority Data

Jun. 29, 2018 (EP) .................................... 18180875

(51) Int. Cl.
*G01R 31/12* (2020.01)
*G01R 1/36* (2006.01)
*G01R 19/145* (2006.01)

(52) U.S. Cl.
CPC ............... *G01R 31/12* (2013.01); *G01R 1/36* (2013.01); *G01R 19/145* (2013.01); *G01R 31/1227* (2013.01); *G01R 31/1272* (2013.01)

(58) Field of Classification Search
CPC ............ G01R 31/1227; G01R 31/1272; G01R 31/12; G01R 1/36; G01R 19/145; G01R 31/14; H02K 11/27; H02K 3/40
See application file for complete search history.

(56) References Cited

U.S. PATENT DOCUMENTS 4,779,051 A 10/1988 Grünewald et al.
6,255,808 B1 7/2001 Hücker
(Continued)

FOREIGN PATENT DOCUMENTS

KR 101477755 B1 12/2014

OTHER PUBLICATIONS

European Patent Office, Extended Search Report issued in corresponding Application No. 18180875.9, dated Jan. 3, 2019, 10 pp.

*Primary Examiner* — Amy He
(74) *Attorney, Agent, or Firm* — Greenberg Traurig, LLP

(57) ABSTRACT

The present application discloses a method and device suitable to perform the method for operating Voltage Indication system (VIS) and partial discharge module (PD) for medium-voltage or high voltage apparatuses, comprising: monitoring, with the partial discharge-module (PD), provided in low-voltage section, whether partial discharge occurs within a dielectric of the high-voltage or medium-voltage apparatus or system, the partial discharge-module or VIS being electrically connected to a coupler provided in the medium-voltage or high-voltage apparatus; indicating with the Voltage Indication System (VIS), provided in a low-voltage portion, the presence of operating voltages in high-voltage or medium-voltage apparatus or system, Voltage Indication System (VIS) being electrically connected with partial discharge-module (PD) and deactivating by deactivation module connected to Voltage Indication System and partial discharge-module (PD) an optical display in the Voltage Indication System (VIS) during partial discharge measurements.

21 Claims, 6 Drawing Sheets

(56) References Cited

U.S. PATENT DOCUMENTS 9,229,043 B2 * 1/2016 Hobelsberger ......... G01R 31/14
2014/0333282 A1 11/2014 Javora et al.

* cited by examiner

PARTIAL DISCHARGE MONITORING SYSTEM WITH A COMPATIBILITY-FUNCTION FOR A VOLTAGE INDICATION SYSTEM

FIELD OF INVENTION

Embodiments of the present disclosure generally relate to monitoring the dielectric strength of a high-voltage installation, especially in a Medium and/or High Voltage area. In particular, embodiments of the present disclosure relate to retrofit of an online partial discharge monitoring system to an existing switchgear installation using an already installed Voltage Indication System or other voltage measurement systems.

BACKGROUND OF INVENTION

Partial Discharges (PD) are characterized in that they can appear as short (duration of nanoseconds) and stochastically recurring discharge events in a dielectrically problematic part of a system. Partial discharge can be measured by looking at an effect of charges flowing during the event. This flow results in temporary voltage changes on a medium- or high-voltage line. In IEC 60270, a standard partial discharge measurement system is shown, which is based on a capacitive coupling to high-voltage, together with a blocking impedance.

In an existing high or medium voltage installation, voltage indication systems are used, which are arranged in a low voltage area or compartment of the medium or high voltage installation. Voltage indication systems may serve as a security function, e.g. for maintenance personnel. A voltage indication system visualizes an existing dangerous voltage in the system and is meant as a voltage measurement system providing a coupling (preferably capacitive coupling) to a high-voltage conductor, for example, but not limited to, a voltage detection systems or voltage presence indication system or similar. It is referred to this collectively as voltage indication system or VIS in the rest of the document. The voltage indication system, as well as the partial discharge measurement system, may also be based on a capacitive coupling to high-voltage. It could be considered as an advantage, if an online partial discharge measurement system could simply be combined with an existing (brownfield) voltage indication system.

Preferably, the retrofitting of an online PD measurement system would be advantageous. However, design of currently available and employed voltage indication systems may disturb a proper measurement of partial discharge measurement systems due to the characteristics of the display used in presently known voltage indication systems.

SUMMARY OF INVENTION

In an aspect and in order to address the foregoing, embodiments of the present disclosure propose a method for operating a Voltage Indication system (VIS) and a Partial Discharge (PD) module for a medium- or high voltage apparatus, comprising: Monitoring, with the PD-module, provided in a low-voltage portion, if a Partial Discharge occurs within a dielectric of a high-voltage or medium-voltage apparatus or system, the PD-module or the Voltage-Indication-System electrically connected to a coupler provided in the medium- or high-voltage apparatus; Indicating with the Voltage-Indication-System, provided in a low-voltage portion, the presence of an operating voltage in a high- or medium-voltage apparatus or system, the Voltage-Indication-System electrically connected with the PD-module; Deactivating, with a deactivation module connected to the Voltage-Indication-System and to the PD-module, an optical display in the Voltage-Indication-System during a PD-measurement.

In another aspect, a partial discharge measuring system for a medium- or high voltage apparatus is disclosed. The measuring system may have a partial discharge-module, which is preferably arranged in a low-voltage portion and can be adapted to monitor, whether a Partial Discharge occurs within a dielectric of the high- or medium-voltage apparatus or system. The partial discharge-module or a VIS may be electrically connected to a coupler, which can be provided in the high-voltage portion, and a deactivation module, which can be adapted to be electrically connected to the VIS in a low-voltage portion and to the partial discharge-module. The VIS may further comprising an optical display to indicate the presence of an operating voltage in the high- or medium-voltage portion. The deactivation module may be adapted such, that the optical display of the VIS is preferably not activated, when a partial discharge-measurement is running.

BRIEF DESCRIPTION OF DRAWINGS

Embodiments of the present disclosure will be presented in the sense of examples and their advantages are explained in greater detail below, with reference to the accompanying drawings, wherein.

DETAILED DESCRIPTION OF EMBODIMENTS

Figure 1:
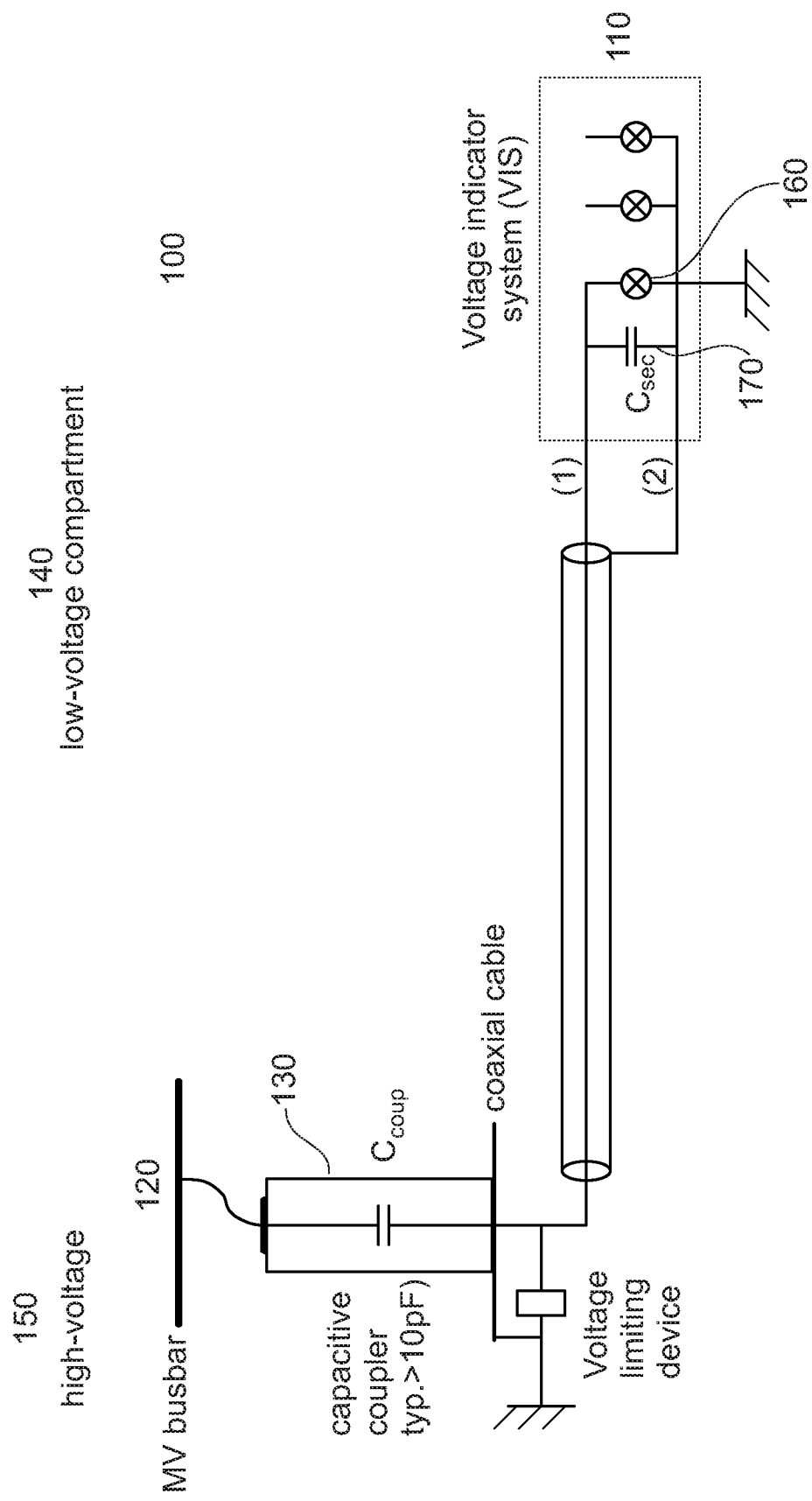
FIG. 1 is a VIS setup as employed in prior art.

Hereinafter, the principle and spirit of the present disclosure will be described with reference to the illustrative embodiments. It should be understood, all these embodiments are given merely for the person skilled in the art to better understand and further practice the present disclosure, but not for limiting the scope of the present disclosure. For example, features illustrated or described as part of one embodiment may be used with another embodiment to yield still a further embodiment. For sake of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e. a definition that is different from the ordinary and customary meaning as understood by those skilled in the art, is intended to be implied by consistent usage of the term or phrase herein. To the extent that a term or phrase is intended to have a special meaning, i.e. a meaning other than that understood by skilled artisans, such a special definition will be expressly set forth in the specification in a definitional manner that directly and unequivocally provides the special definition for the term or phrase. Same items are designated with same reference signs throughout description claims and drawings.

Partial Discharges (PD) in medium or high-voltage equipment could lead to (in)direct failures. The subject matter of the present disclosure is the retrofit of online partial discharge monitoring system to an existing switchgear installation.

The retrofit is performed by reusing an already installed Voltage Indication System (VIS). The present application proposes measures to overcome drawbacks with high-frequency partial discharge-like noise, generated by many brownfield Voltage Indication Systems. The present disclosure may improve sensitivity of online partial discharge monitoring systems, in particular of an online partial discharge monitoring system, which can be retrofitted to those type of Voltage Indication System. The application also allows for estimation of various unknown parameters of the installation pertinent to partial discharge monitoring. In particular, a controlled use of the proposed principle enables online tracking of variations of the system capacitance, due to breaker opening or closing within a line-up. The measured partial discharge apparent charge is corrected accordingly and one avoids mistaking a change of topology for a variation in partial discharge strength.

Figure 2:
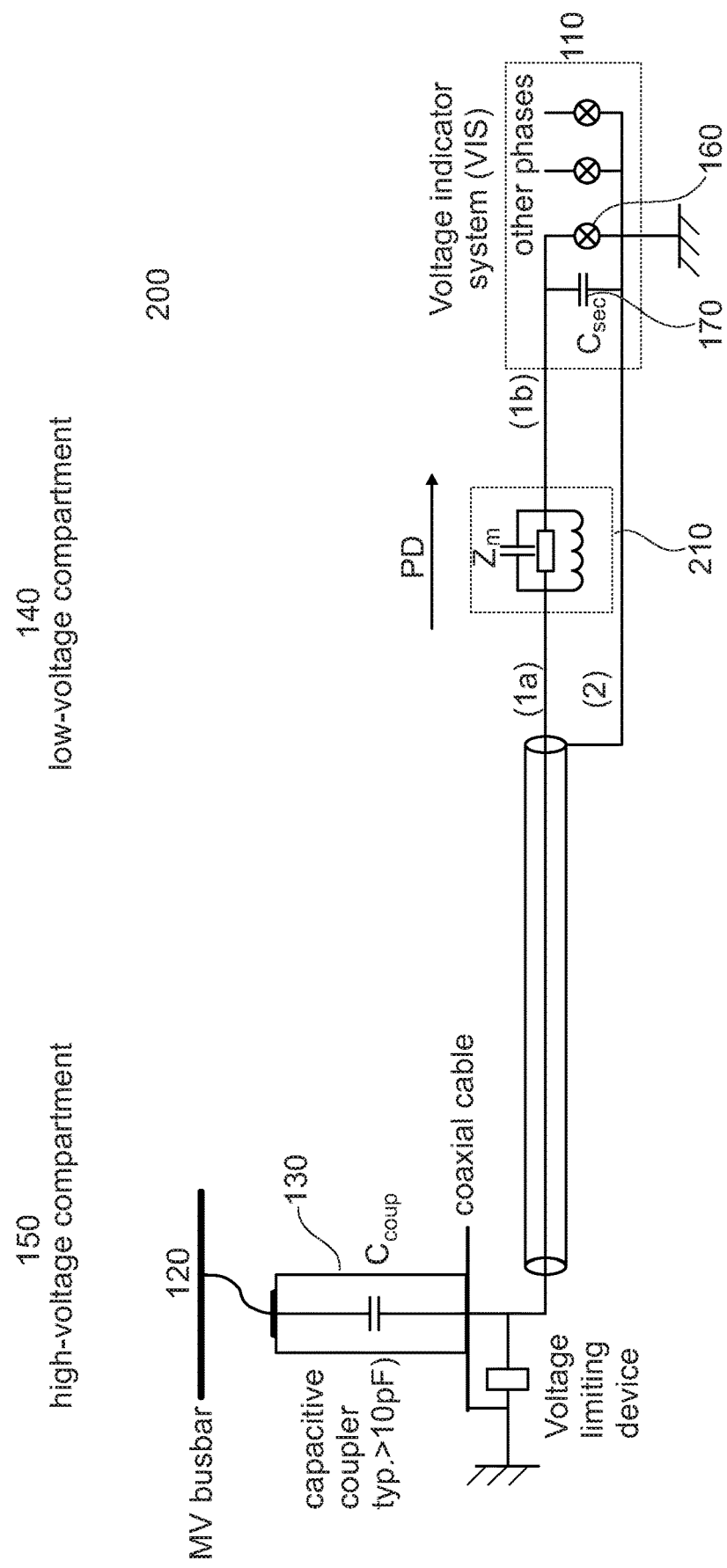
FIG. 2 is an integration of partial discharge measurement with VIS according to embodiments of the present application.

Retrofitting an online partial discharge monitoring system 210, as shown in FIG. 2, using an existing Voltage Indication System 100 as shown in FIG. 1 has the advantage, that no access or modification to the high-voltage compartment is required. High-voltage coupler 130 and the cable (possibly of coaxial type) used for the Voltage Indication System 110 are reused. Installation of an additional coupler, as coupler 130, is not necessary. The installation effort is reduced and the hardware costs are lowered. Additionally, it need not be required to shut down the high voltage power supply.

A Voltage Indication System setup 100, as is commonly used in the field, is shown in FIG. 1. A high-voltage coupler 130 (typically capacitive coupler) is needed to make an electrical connection to a busbar 120. Capacitive coupler 130 is connected to the Voltage Indication System 110 via a cable, preferably a coaxial cable, because the coaxial cable provides a better shielding from external influences as an un-shielded two-wire cable would provide. A signal wire (1) and shield (2) are connected to the Voltage Indication System 110. The Voltage Indication System 110 may also contain a secondary impedance 170, in this case the capacitor $C_{sec}$ that may serve as a voltage divider, together with the coupler impedance capacitor $C_{comp}$ present in the capacitive coupler 130. A lamp 160, which may be a discharge lamp or an LED, may be connected across the secondary impedance 170 and lights up, when the voltage on busbar 120 is above a certain level.

FIG. 2, in particular, illustrates how a partial discharge measurement system 210 is integrated to the system of FIG. 1. Wire (1), from the coaxial cable, is separated with connection points (1a) and (1b). Partial discharge measurement system 210 is connected between these two connection points (1a), (1b). Other parts of system 100 in FIG. 1 remain unchanged.

To retrofit an online partial discharge monitoring system to an existing Voltage Indication System, some considerations are necessary. When retrofitting the partial discharge monitoring system 210 to an existing voltage indication system 110, it should be assured that the voltage indication system 110 functionality is not influenced. Another issue, linked with the aforementioned, is, that the voltage indication system should not disturb the partial discharge measurement.

Advantageously, the partial discharge monitoring system 210 should be transparent to the Voltage Indication System 110. Expressed in other words, the partial discharge monitoring system 210, when retrofitted, should behave, as if only an un-interrupted wire (1) is arranged between the capacitive coupler and the voltage indication system. Preferably, this may also be valid in case that any kind of failure occurs in the partial discharge monitoring system 210.

Conversely, also the voltage indication system should preferably be transparent to the partial discharge monitoring system. In other words, the partial discharge monitoring system or the voltage indicator system shall perform as if the respective other system is not present and there is no mutual influencing.

The requirement that the voltage indication system is transparent to the partial discharge monitoring system may suffer from the fact, that many Voltage Indication Systems use glow lamps. Generally, a glow lamp is an electric gas-discharge lamp. The effect produced by an active glow lamp is similar to that of a partial discharge due to flickering, as the glow patch is moving on the cathode. The glow lamp therefore may produce high-frequency fluctuation that are stochastically synchronous with the power line signal.

Additionally, some Voltage Indication Systems 110 are based on non-linear and oscillatory circuits, which also create partial discharge-like signals. Another drawback is, that the switch-on of the lamp 160, which typically happens at a certain forward voltage level, will clip or distort the measurement of the line voltage. This line voltage is an important input to the phase determination, which is needed in order to provide a phase-resolved partial discharge image. A solution would be to replace the Voltage Indication System 110 by a solution not based on a glow lamp 160, e.g. based on LED or similar and having a partial discharge-friendly behaviour.

However, it is preferred on the field of these monitoring systems, to integrate specific Voltage Indication System existing in switchgears, with online partial discharge monitoring systems. In those cases, the Voltage Indication System cannot simply be exchanged and is likely producing high-frequency signals, which influence a measurement in the partial discharge monitoring system. In other words, an online partial discharge monitoring system for retrofitting must be configured to accommodate those Voltage Indication System.

To illustrate the problem in more details, reference is again made to FIG. 2. A partial discharge monitoring system is retrofitted to a Voltage Indication System. The partial discharge monitoring system can basically be considered as an equivalent circuit diagram with impedance $Z_m$. Impedance $Z_m$ is inserted into the coaxial connection line from coupler 130 to Voltage Indication System 110, symbolized by (1a) and (1b). Impedance $Z_m$ is designed in such a way that it exhibits a low-impedance at low-frequency (i.e. at 50 Hz) and higher impedance at high-frequency. Low impedance means that $Z_m$ is preferably transparent for the Voltage Indication System. The second characteristic means that fast voltage variations (e.g. partial discharges) on the high-voltage busbar 120 are translated to fast voltage variations across the impedance $Z_m$, whose capacitor forms a voltage divider with the coupling capacitor.

It is assumed that the Voltage Indication System 110 is based on glow lamps 160. As already mentioned, flickering of the glow lamp 160 results in a high-frequency voltage fluctuation. This fluctuation is a few millivolts in amplitude and induces a variation across $Z_m$ (PD, 210) that is of the same order of magnitude than that typically generated by a 100 pC (pico Coulomb) discharge on the busbar 120.

Said in yet other words, the flicker may erroneously be interpreted as a partial discharge by the partial discharge monitoring system or, even worse, may mask actual partial discharges.

Figure 6:
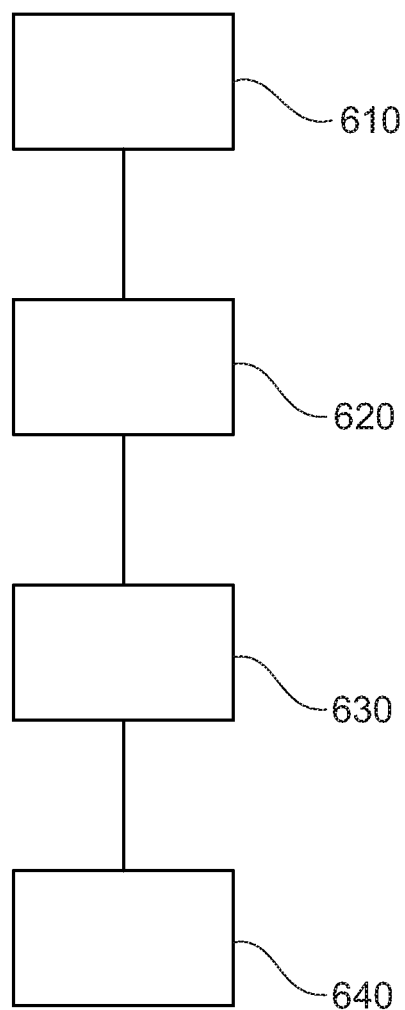
FIG. 6 sketches embodiments of a method

Therefore, in a first aspect of the present application and with reference to flow diagram in FIG. 6, a method 600 for operating a Voltage Indication system 110 (VIS) and a Partial Discharge (PD) module for a medium- or high voltage apparatus is disclosed to reduce the detrimental effect of VIS on the partial discharge monitoring system while maintaining the VIS functionality.

The method 600 may comprise: Monitoring 610, with the partial discharge-module, provided in a low-voltage portion 140, if a Partial Discharge occurs within a dielectric of a high-voltage or medium-voltage apparatus or system, the partial discharge-module or the VIS being electrically connected to a coupler provided in the medium- or high-voltage apparatus; Indicating 620 with the VIS, provided in a low-voltage portion, the presence of an operating voltage in a high-voltage or medium-voltage apparatus or system, the VIS being electrically connected with the partial discharge-module; Deactivating 630 with a deactivation module 310, which is connected to the VIS and to the partial discharge-module, an optical display in the VIS during a partial discharge-measurement.

Figure 3:
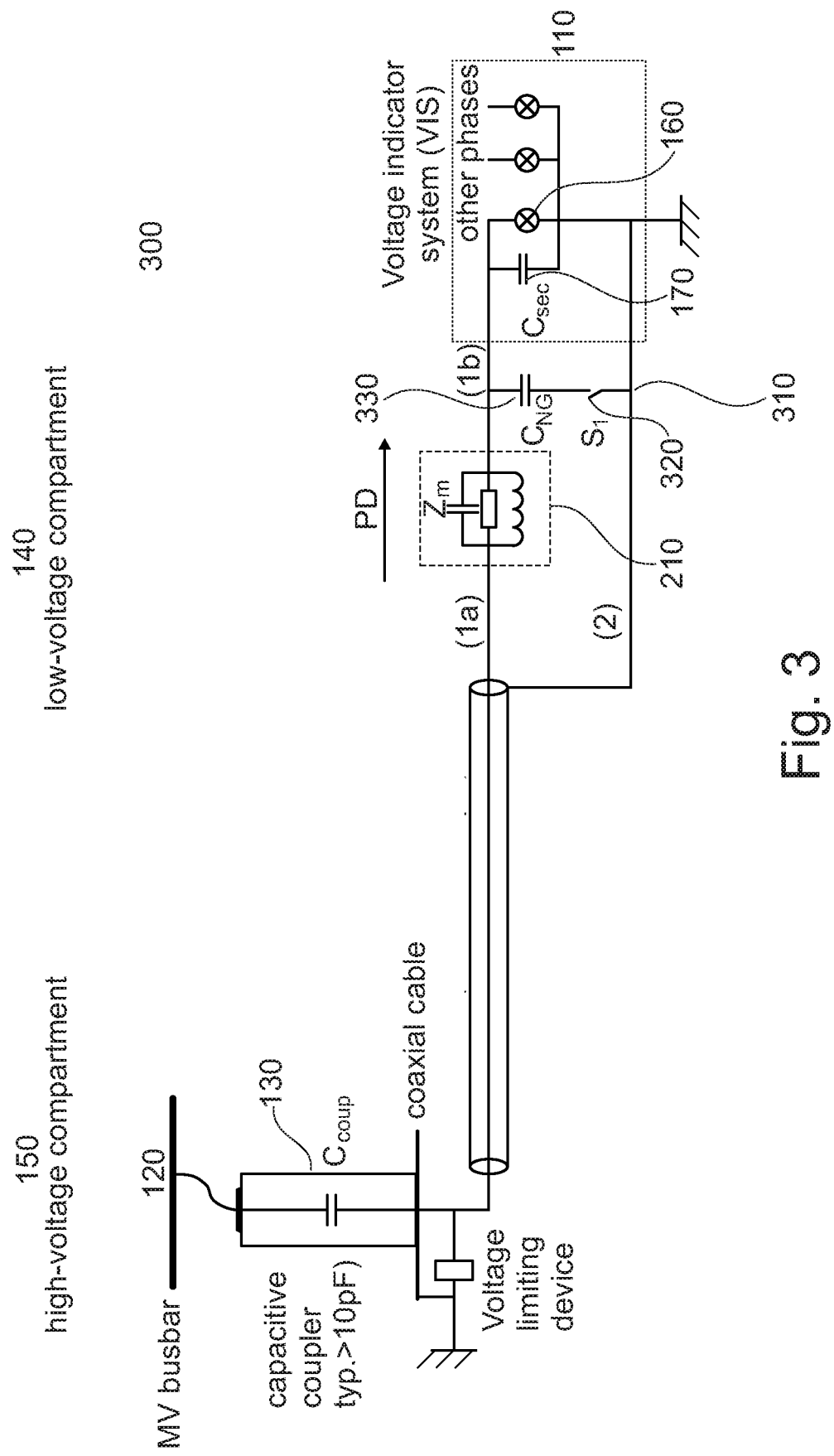
FIG. 3 is an embodiment of a solution of the present application.

With a deactivation module 310, it can therefore be assured, that the partial discharge measurement system 210 only performs a measurement when glow lamps 160 of the voltage indication system 110 are not active. The proposed solution is shown in FIG. 3 and may consist of an additional "No-Glow" element $C_{NG}$ 330 (here a capacitor) and a switch $S_1$ providing a lower impedance path. The switch $S_1$ 320 is preferably closed during the time when partial discharge measurements are performed.

In this case, the overall secondary capacitor value is increased to the value of $C_{NG}+C_{sec}$. If the overall secondary capacitor is large enough (i.e. $C_{NG}+C_{sec} \approx C_{NG}$ that is to say $C_{NG} \gg C_{sec}$), the voltage (1b)-(2) across the points (1b) and (2) may remain below an ignition voltage of the glow lamp 160. The glow lamp 160 does not light up and no flicker occurs.

The power signal is still present and can be measured by the partial discharge monitoring system 210. When the switch $S_1$ is open, the Voltage Indication System may work as usual.

The switch $S_1$ is duty-cycled so that an average lighting intensity of the glow lamp 160 is not reduced below an intensity required by regulatory standard or the off-periodicity is according to regulatory standard. In other words, the brightness of the lamps 160 is preferably not or not essentially reduced, so that their function is maintained according to e.g. governmental regulations. An exact value of $C_{NG}$ is relatively unimportant, as long as the value of the capacitor is large enough to prevent ignition of the glow lamp 160. The principle may also be applied to resistive or hybrid dividers.

The provided function, which may ensure a compatibility between a partial discharge measuring system and a voltage indication system ("no-glow") could also be realised by a short (i.e. short-circuit) instead on impedance. However, this would not allow the partial discharge measurement system to measure the power signal (i.e. 50 Hz) via a simple voltage measurement. However, measuring the current through the short may be used.

In another aspect of the method, it is disclosed, that the VIS 110 can be deactivated, with the deactivation module 310, wherein the deactivation module 310 may comprise a serial connection of at least an electronic component and a switch. The switch can be adapted to switch the electronic component parallel to the Voltage Indication System. The partial discharge module may be adapted to control the switch. The electronic component of other embodiments may consist of a resistor and/or a capacitor.

In yet another aspect, the Voltage Indication System is activated, when the switch is in an open condition and the Voltage Indication System is deactivated, when the switch is in a closed condition.

In yet another aspect the partial discharge module, which controls the switch, may be adapted to ensure, that a time portion in which the Voltage Indication System indicates the presence of an operating voltage in the high-voltage or medium-voltage portion is longer than a time portion in which the partial discharge module performs a measurement.

Figure 4:
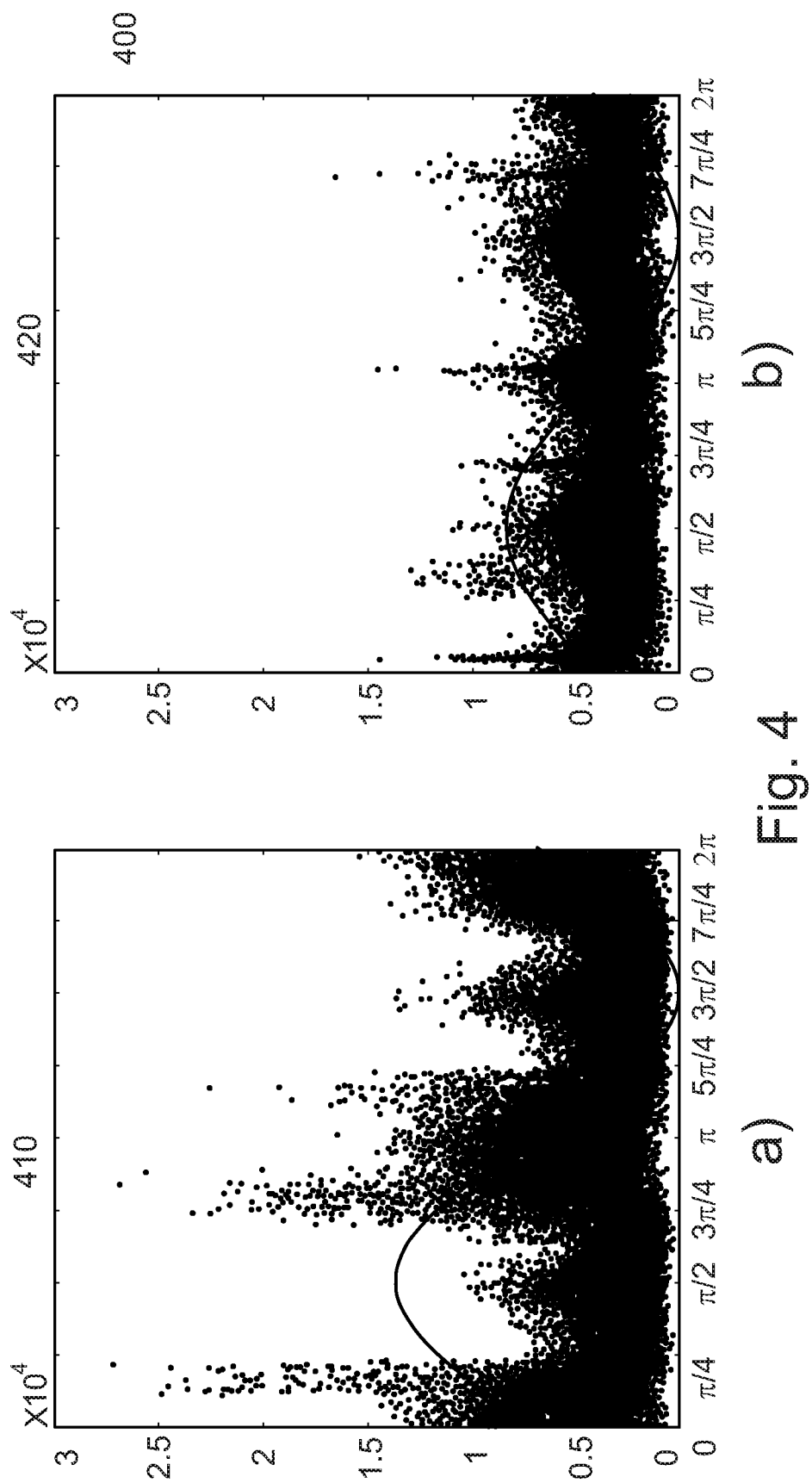
FIG. 4 is an illustration of an effect of an embodiment of the disclosure on a PRPD pattern

FIGS. 4a) and 4b) illustrate an effect of measuring partial discharge on a PRPD (phase resolved partial discharge pattern) in presence of a voltage indication system 110 with a compatibility function ("No-Glow") feature turned off or on. Y-axis shows the PD amplitude in arbitrary units (500 pC would typically correspond to around $10^4$ arbitrary units).

The FIGS. 410, 420 (FIG. 4a), FIG. 4b)) show the PRPD pattern for low-frequency (50-150 kHz band), but measurements at higher frequency exhibit reduced background noise. A glow-lamp 160 (FIG. 4a)) effectively produces partial discharge-like structures 410 that are suppressed by turning on the "No-Glow" feature (FIG. 4b)). In the latter case, finer structure 420 appears that were previously masked.

In another aspect a partial discharge measuring system for a medium-voltage or high voltage apparatus is disclosed which may comprise: a partial discharge-module, that can be arranged in a low-voltage portion and maybe adapted to monitor, whether a Partial Discharge occurs within a dielectric of the high-voltage or medium-voltage apparatus or system; the partial discharge-module or a Voltage Indication System can be electrically connected to a coupler 130 provided in the high-voltage portion; a deactivation module 310, adapted to be electrically connected to the Voltage Indication System 110 in a low-voltage portion and to the partial discharge-module 210, the Voltage Indication System 110 further comprising an optical display 160 to indicate the presence of an operating voltage in the high- or medium-voltage portion, the deactivation module 310 may further be adapted such, that the optical display 160 of the Voltage Indication System 110 may not be activated when a partial discharge-measurement is running.

In an aspect of the present disclosure, the deactivation module 310 may comprise a serial connection of a capacitor 330 and a switch 320. The serial connection may be arranged such that the serial connection may bypass the Voltage Indication System 110 in case the switch 320 is closed. The partial discharge module 210 may be adapted to control the switch.

In a preferred aspect of the present disclosure, the switch 320 may comprise a relay. In another preferred aspect, the switch may comprise a semiconductor. The partial discharge module 210 may be adapted to control the switch 320.

In yet another aspect of the present disclosure the Voltage Indication System 110 can be activated, when the switch 320 is in an open condition. The voltage indication system 110 can be deactivated, when the switch is in a closed condition.

In another aspect of the present disclosure, the partial discharge-module, which controls the switch, may be adapted to ensure, that a time portion in which the Voltage Indication System indicates the presence of an operating voltage in the high-voltage or medium-voltage portion can be longer than a time portion in which the partial discharge module performs a measurement.

In another aspect of the present application, the deactivation module 310 may comprise at least two terminals, wherein a first of the at least two terminals is electrically connected to the partial discharge-module and a second of the at least two terminals is electrically connected with a ground connection.

In another aspect, the present application discloses that the partial discharge-module, which controls the switch, may be adapted to ensure, that a time portion in which the Voltage Indication System indicates the presence of an operating voltage in the high- or medium-voltage portion is longer than a time portion in which the Voltage Indication System does not indicate the presence of voltage in the high-voltage or medium-voltage portion.

The present disclosure, as presented, therefore enables online partial discharge monitoring retrofitted on installed Voltage Indication System hardware while preserving the VIS functionality. The provided solution reduces generation of high frequency noise from the Voltage Indication System 110 and enables partial discharges to be measured in an undisturbed way.

The provided solution also allows for a more robust determination of a phase of the high-voltage. In some embodiments, the proposed solution consists in temporarily shunting a large capacitor $C_{NG}$ in parallel to the Voltage Indication System 110 during the measurement of partial discharge.

The larger additional capacitance $C_{NG}$ increases a division ratio of a voltage divider formed by a capacitor $C_{Coup}$ in the capacitive coupler 130 and $C_{sec}$ in the VIS. This voltage divider is arranged between the busbar 120 voltage and the VIS. The increased division ratio ensures, that the glow lamp 160 does not light up or ignites. In order not to disturb the correct functioning of the Voltage Indication System, the shunting of this additional large capacitor is temporarily and infrequent, e.g. during 100 ms every second.

The additional capacitor is switched in a way, that the lamps of the voltage indication system have a sufficient brightness due to safety regulations for high-voltage installations.

Figure 5:
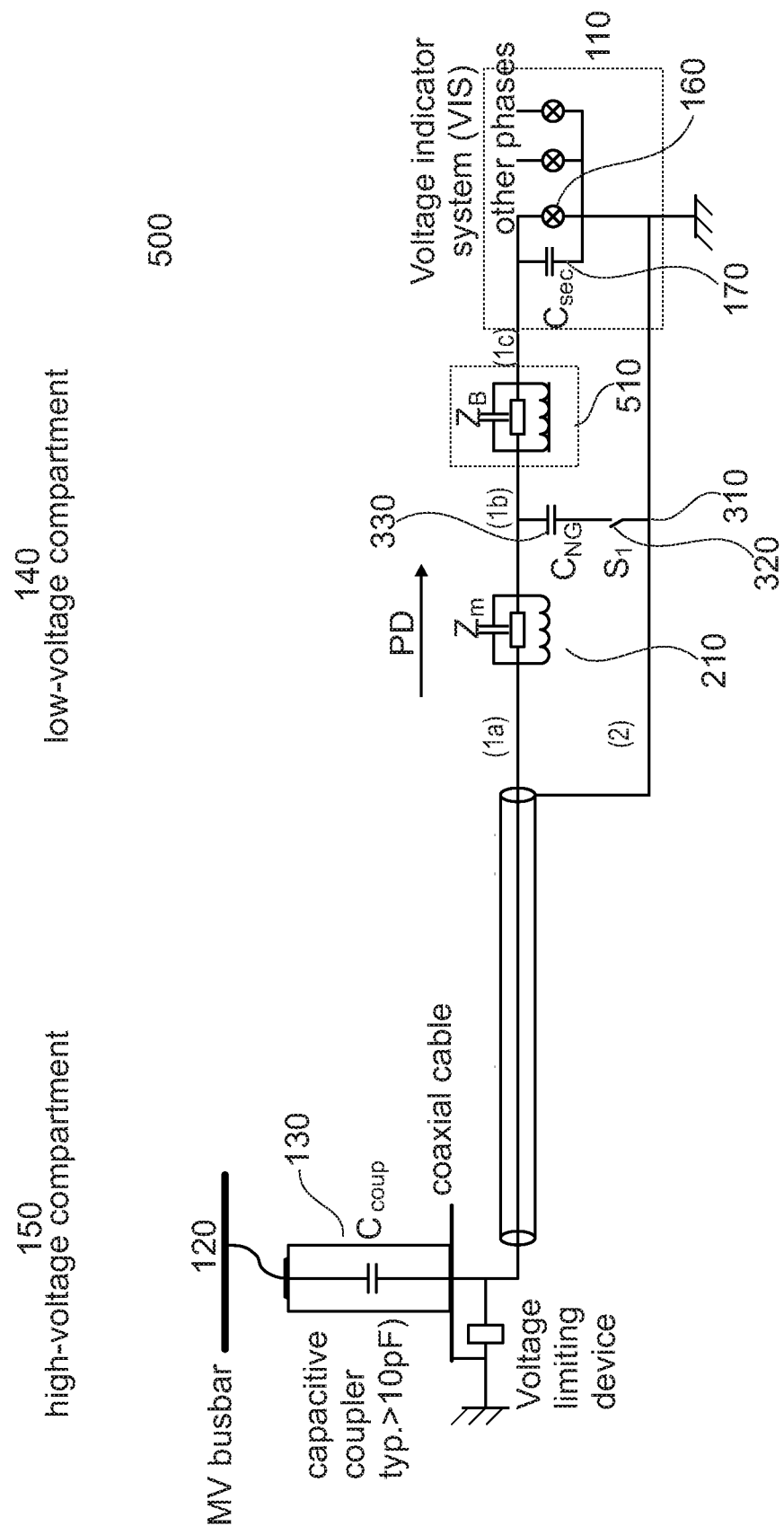
FIG. 5 is an embodiment of a solution of the present application.

A further possible and advantageous embodiment is shown in FIG. 5. In particular, an element $Z_B$ 510 (whose impedance may be up to magnitudes higher than that of $C_{NG}$ at high-frequency) can be placed between $C_{NG}$ and Voltage Indication System 110 (VIS) in order to block remaining high-frequency noise generated in the Voltage Indication System 110 (VIS). In principle, this latter configuration could be operated without switch $S_1$ altogether. The choice of $Z_B$ and $C_{NG}$ depends on specific details of each specific system and may lead to limitations in systems which are not suitable for this configuration.

In another advantageous embodiment, an improved response time of the system can be achieved by closing switch $S_1$ dependent on a voltage on the phase. In particular, the switch may be closed, if the voltage is close to voltage zero.

Since Voltage Indication System setups are of high impedance, transients induced by connecting and disconnecting the "no-glow" impedance need tens of millisecond to go to a steady state. Since the duty cycle is limited (in order to get an acceptable light intensity from the Voltage Indication System), a time slot during which partial discharge can be measured is small.

It would thus be of advantage to reduce a transient duration and thus to maximize the duration in which partial discharge can be measured. This is possible by closing $S_1$ near voltage zero crossings. The partial discharge system has a voltage measurement capability built in, which can be used to determine an instant voltage value. In a three phase system, this would imply, that "no-glow" switches need to be controlled independently.

A further possible embodiment of the presented disclosure can be seen in an online estimation capability of the Voltage Indication System parameter, e.g. a coupler impedance. Reference is made to FIG. 3: In the retrofit scenario, the values $C_{coup}$ (capacitive coupler) and $C_{sec}$ (secondary capacitance) are often unknown, either because their design values are not available, or tolerances from production are high. The sensitivity of the partial discharge monitoring system is thus unknown. The presence of the switchable $C_{NG}$ allows for an online estimation of these values. The simplified case is considered, where the effect of the connection from the coupler 130 to the partial discharge system is negligible. In this case, and when the busbar 120 is powered, an RMS value of a voltage drop across (1b)-(2) is either equal to:

$$v_{off} = V_{busbar} \cdot C_{sec}^{-1} / (C_{sec}^{-1} + C_{coup}^{-1}) = V_{busbar} \cdot C_{coup} / (C_{sec} + C_{coup})$$

or $$v_{on} = V_{busbar} \cdot (C_{sec} + C_{NG})^{-1} / ((C_{sec} + C_{NG})^{-1} + C_{coup}^{-1}) \approx$$
$$V_{busbar} \cdot C_{NG}^{-1} / (C_{NG}^{-1} + C_{coup}^{-1}) = C_{coup} / (C_{NG} + C_{coup}) \cdot V_{busbar}$$

depending on the state of switch $S_1$. Both $v_{off}$ and $v_{on}$ can be measured by the partial discharge monitoring system, and $C_{NG}$ is known by design.

Thus knowing the value of the voltage $V_{busbar}$ of the busbar 120 allows one to estimate the value of $C_{coup}$ and $C_{sec}$ (two equations with two unknowns).

For a further embodiment, it is assumed, that $v_{off} \approx V_{busbar} \cdot (C_{coup}/C_{sec})$ and $$v_{on} \approx V_{busbar} \cdot C_{Coup}/C \text{ as } C_{Coup} << C_{sec} \text{ and } C_{sec} << C_{NG}$$

so that $$v_{on}/v_{off} \approx C_{sec}/C_{NG}$$

This approximation allows an estimation of $C_{sec}$ without even knowing the busbar 120 voltage. Once $C_{sec}$ is known, it is straightforward to calculate $C_{coup}$ using the equations for $v_{off}$ and/or $v_{on}$.

For another embodiment, estimating $v_{off}$ accurately is difficult, as in this case the glow lamp 160 is on and introduces non-linearity. On the other hand, it is straightforward to analyse the time sequence (t), i.e. before RMS (Root Mean Square) calculation, to detect the zero crossings and to use the signal around those to determine which amplitude the signal would have been without the glow lamp 160.

For another embodiment, if $C_{coup}$ and $C_{sec}$ are known, it is furthermore possible to estimate the capacitance of the system by analysing the partial discharge signals measured during the offline calibration phase. It is considered, that the measurement impedance is mostly capacitive and equal to $C_m$ at high-frequency. In this case the voltage across the measurement impedance is equal to:

$$v_{cal} = V_{busbar} \cdot C_m^{-1}((C_{sec} + C_{NG})^{-1} + C_{Coup}^{-1} + C_m^{-1})$$
where $V_{busbar} = q/C_{sys}$ The voltage $v_{cal}$ is measured, $C_m$ and $C_{NG}$ are known by design, $C_{coup}$ and $C_{sec}$ were previously estimated, and q is set by a calibrated charge injector. In other words, it is possible to estimate the value of the system capacitance $C_{sys}$.

For another embodiment, it may also be possible to track a change of the system capacitance, as switching on and off the switch $S_1$ actually changes the system capacitance $C_{sys}$ and thus the amplitude of the measured partial discharge.

A further possible embodiment relates to generating synthetic partial discharges to estimate a system capacitance. Closing of "No-Glow" switch $S_1$ results in an effect that can be similar to a partial discharge.

More precisely, if "No-Glow" switch $S_1$ is closed while a voltage V is present across (1b)-(2), effects on busbar 120 are similar to a partial discharge having an apparent charge proportional to $V \cdot C_c$ where $C_c$ is a coupler 130 capacitance. On the other hand, an actual voltage drop on the busbar 120 is given by $V \cdot C_c V_{busbar}$ wherein $C_{sys}$ is the system capacitance. If a second partial discharge monitoring system captures this synthetic partial discharge generated by the first partial discharge monitoring system, the information contained in the two partial discharge monitoring systems is sufficient to estimate the system capacitance $C_{sys}$ online.

This is an important factor as the measured amplitude of the apparent charge is directly proportional to system capacitance $C_{sys}$, which may change over time due to opening and closing of breakers in the line-up. For example, closing the "No-Glow" switch with 10 V across (1b)-(2) results in synthetic partial discharge having a similar effect like a 100 pC apparent charge.

In particular, a first-order estimate of the system capacitance $C_{sys}$ is given by $V \cdot C_{c1}/(V_{meas} \cdot \alpha_2)$, wherein $\alpha_2$ is an 'attenuation' of the second system (i.e. the ratio between voltage changes on the busbar 120 and their effect on the measurement impedance), $V_{meas}$ is a voltage measured across the measurement impedance of the second partial discharge monitoring system, $C_{c1}$ is the capacitances of the coupler in the first system and V is the voltage level at which the first system closes the "No-Glow" switch. Note that the $C_{c1}$ can be estimated by methods shown earlier in this invention while $\alpha_2$ can be derived from $C_{c2}$ (which can be estimated similarly like $C_{c1}$) and the value of the measurement impedance, and both V and $V_{meas}$ are measured values. In other words, all parameters are known in order to get a first-order estimated of the system capacitance.

The described possibility of measuring a system capacitance with a synthetic partial discharge can be extended in a way that a synthetic partial discharge pilot signal is used to track variations of the system capacitance. The first partial discharge system can be programmed to generate synthetic partial discharge within each power cycle (or every N cycles) when the voltage across (1b)-(2) reaches a predetermined voltage value $V_{pilot}$ or a fraction of the maximum voltage.

In this case, the first partial discharge system may generate synthetic partial discharges at known and fixed time intervals and of constant amplitude. This signal, that can be named "pilot signal", can be used by other monitoring systems to track any change in system capacitance (for example resulting from opening or closing of breakers) and hence correct the measured apparent charge accordingly.

Advantageously, there is no need that the partial discharge monitoring systems communicate other than through the pilot signal. The pilot signal can further be used to synchronize multiple partial discharge monitoring systems.

A system parameter identification is possible in another embodiment of the present disclosure. This is an extension of the setting, where two partial discharge systems are installed and are able to generate a synthetic partial discharge signal. In this extension it is intended, that an estimation of the impulse response can be performed (or equivalently a transfer function) instead of solely the system capacitance.

A synthetic partial discharge is therefore generated on the first system, the discharge of the capacitors will generate an impulse-like signal. On the second partial discharge system, it will be measured a signal filtered by the system. The filtered signal is akin to the impulse response of the system. By analysing the filtered impulse-like signal generated at the first partial discharge system and measured at the second partial discharge system, it may be possible to estimate the impulse response of the system. The impulse response of the system can be estimated either in a non-parametric way, by finding the finite impulse response (FIR), or parametrically by fitting a predefined parametric model.

Another embodiment of the presented disclosure may enable to calibrate partial discharge system monitoring with a synthetic partial discharge pilot signal. A pilot signal is generated at a known location on the busbar 120 by the first partial discharge monitoring system 210. In this embodiment, a method for the calibration of the partial discharge monitoring system is described, in particular a method for calibration of the estimated partial discharge amplitude.

It is considered, that partial discharge monitoring systems can be tuned to analyse different frequencies. The amplitude of the estimated partial discharge may vary largely depending on the frequency analysed. This effect may be due to electrical properties of the system including resonances and system changes due to the connection or disconnection of additional machinery to the busbar 120. Since the pilot signal has known amplitude and/or constant amplitude, it is possible to use it to calibrate an estimated partial discharge amplitude at the monitoring system. This calibration can account for the different frequencies analysed and also for system changes.

According to another aspect of the present application, the system may further comprise a network interface for connecting the system and/or components of the system to a data network, in particular a global data network.

The data network may employ a network protocol such as e.g. TCP/IP as used in Internet data transmission. The system may be operatively connected to the network interface for carrying out commands received from the data network. The commands may include a control command for controlling the system or its components to carry out a task such as initiating a measurement, a data transmission of measured data or any other task. In this case, the device/controller is adapted for carrying out the task in response to the control command. The commands may include a status request. In response to the status request, or without prior status request, the device/controller may be adapted for sending a status information to the network interface, and the network interface is then adapted for sending the status information over the network. The commands may include an update command including update data. In this case, the device/controller is adapted for initiating an update in response to the update command and using the update data. The network may use transmission techniques such as wireless (WLAN, BT etc.) The network may be a WAN (Wide Are network) which allows for controlling the system in distant locations e.g. in another country.

The data network may comprise distributed storage units such as Cloud. Depending on the application, the Cloud can be in form of public, private, hybrid or community Cloud.

The invention claimed is:

1. A method for operating a Voltage Indication System (VIS) and a partial discharge-module for a medium-voltage or high voltage apparatus, the method comprising:
monitoring, with the partial discharge-module, provided in a low-voltage portion, whether a partial discharge occurs within a dielectric of a high-voltage or medium-voltage apparatus or system, the partial discharge-module or the VIS being electrically connected to a coupler provided in the medium-voltage or high-voltage apparatus;
indicating with the VIS, provided in a low-voltage portion, a presence of an operating voltage in a high-voltage or medium-voltage apparatus or system, the VIS being electrically connected with the partial discharge-module; and
deactivating, with a deactivation module connected to the VIS and to the partial discharge-module, an optical display in the VIS during a partial discharge measurement,
wherein the partial discharge-module is adapted to ensure, that a time portion in which the VIS indicates the presence of an operating voltage in the high-voltage or medium-voltage portion is longer than a time portion in which the partial discharge-module performs a measurement.

2. The method according to claim 1, further comprising:
deactivating the VIS with the deactivation module,
wherein the deactivation module comprises a serial connection of at least an electronic component and a switch, the switch being adapted to switch an electrical component parallel to the VIS; and
controlling the switch with the partial discharge-module.

3. The method according to claim 2, wherein the electronic component is a resistor or a capacitor.

4. The method according to claim 3, wherein the VIS is activated, when the switch is in an open condition and the VIS is deactivated, when the switch is in a closed condition.

5. The method according to claim 2,
wherein the VIS is activated when the switch is in an open condition; and
the VIS is deactivated when the switch is in a closed condition.

6. A partial discharge measuring system for a medium-voltage or high voltage apparatus, the partial discharge measuring system comprising:
a partial discharge-module, arranged in a low-voltage portion and adapted to monitor, whether a Partial Discharge occurs within a dielectric of the high-voltage or medium-voltage apparatus or system,
the partial discharge-module or a Voltage Indication System (VIS) being electrically connected to a coupler provide in the high-voltage portion;
a deactivation module adapted to be electrically connected to the VIS in a low-voltage portion and to the partial discharge-module, the VIS further comprising an optical display to indicate a presence of an operating voltage in the high-voltage or medium-voltage portion,
the deactivation module being further adapted such, that the optical display of the VIS is not activated when a partial discharge measurement is running; wherein
the partial discharge-module is adapted to ensure, that a time portion in which the VIS indicates the presence of an operating voltage in the high-voltage or medium-voltage portion is longer than a time portion in which the VIS does not indicate the presence of voltage in the high-voltage or medium voltage portion.

7. The partial discharge measuring system according to claim 6,
wherein the deactivation module comprises a serial connection of a capacitor and a switch, arranged such that the serial connection bypasses the VIS in case the switch is closed, and wherein the partial discharge-module is adapted to control the switch.

8. The partial discharge measuring system according to claim 7,
wherein the switch comprises a relay or a semiconductor adapted to be controlled by the partial discharge-module.

9. The partial discharge measuring system according to claim 8, wherein the VIS is activated, when the switch is in an open condition and the VIS is deactivated, when the switch is in a closed condition.

10. The partial discharge measuring system according to claim 7,
wherein the VIS is activated when the switch is in an open condition; and
the VIS is deactivated when the switch is in a closed condition.

11. The partial discharge measuring system according to claim 7,
wherein the deactivation module is adapted to determine an estimated impedance of coupler,
wherein the estimated impedance is a function of values of a voltage of a busbar, a state of the switch in the deactivation module and a voltage drop across connection points, and
wherein the voltage drop is a voltage $v_{off}$ or a voltage $v_{on}$, dependent on a position or state of the switch.

12. The partial discharge measuring system according to claim 7, wherein the switch comprises a relay or a semiconductor adapted to be controlled by the partial discharge-module.

13. The partial discharge measuring system according to claim 7, wherein the VIS is activated, when the switch is in an open condition and the VIS is deactivated, when the switch is in a closed condition.

14. The partial discharge measuring system according to claim 7, wherein the deactivation module comprises at least two terminals, wherein a first of the at least two terminals is electrically connected to the partial discharge-module and a second of the at least two terminals is electrically connected with a ground connection.

15. The partial discharge measuring system according to claim 7, wherein the VIS is activated when the switch, which is controlled with the partial discharge-module, is in an open condition; and the VIS is deactivated when the switch is in a closed condition.

16. The partial discharge measuring system according to claim 6,
wherein the deactivation module comprises at least two terminals, wherein a first of the at least two terminals is electrically connected to the partial discharge-module and a second of the at least two terminals is electrically connected with a ground connection.

17. The partial discharge measuring system according to claim 6,
wherein the deactivation module is adapted to generate a synthetic partial discharge pulse which is used to determine a system capacitance.

18. The partial discharge measuring system according to claim 6,
wherein a first partial discharge system is adapted to generate synthetic partial discharge pulses at predetermined time intervals and with a predetermined amplitude,
wherein the generated synthetic partial discharge pulses are such, that changes in a system capacitance can be tracked by other monitoring systems, and
the other monitoring systems are adapted to correct the partial discharge measurements based on the tracked system capacitance changes.

19. The partial discharge measuring system according to claim 6, wherein the system further comprises:
a network interface for connecting the partial discharge measuring system and/or parts of the partial discharge measuring system to a data network,
wherein the partial discharge measuring system is operatively connected to the data network interface for at least one of carrying out a command received from the data network and sending device status information to the data network; and
a processing unit for converting a signal, generated by components of the partial discharge measuring system, into a digital signal, being adapted to be transmitted over the network interface.

20. The partial discharge measuring system according to claim 6, wherein the coupler includes a capacitive coupler.

21. The partial discharge measuring system according to claim 6, wherein the optical display includes a glow lamp.

* * * * *